US008525342B2

(12) United States Patent
Chandrasekaran et al.

(10) Patent No.: US 8,525,342 B2
(45) Date of Patent: Sep. 3, 2013

(54) DUAL-SIDE INTERCONNECTED CMOS FOR STACKED INTEGRATED CIRCUITS

(75) Inventors: Arvind Chandrasekaran, San Diego, CA (US); Brian Henderson, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 190 days.

(21) Appl. No.: 12/758,164

(22) Filed: Apr. 12, 2010

(65) Prior Publication Data
US 2011/0248403 A1 Oct. 13, 2011

(51) Int. Cl.
*H01L 23/532* (2006.01)
*H01L 23/522* (2006.01)

(52) U.S. Cl.
USPC ............ 257/770; 257/E23.145; 257/E29.281; 257/E29.137; 257/774; 257/705; 257/777; 257/686; 257/773; 257/778; 257/347; 257/408; 257/409; 257/336; 257/344; 257/345; 257/349; 257/352; 257/410; 257/66

(58) Field of Classification Search
USPC ................. 257/770, 774, E23.145, E21.705, 257/777, 723, 686, 685, 773, 778, 737, 734, 257/738, 347, 408, 409, 336, 344, 345, 349, 257/352, 410, 66, E29.281, E29.137, E21.205, 257/E21.415; 438/109, 107
See application file for complete search history.

(56) References Cited

U.S. PATENT DOCUMENTS

| 5,920,094 | A  | * | 7/1999  | Nam ............................. 257/347 |
| 6,159,780 | A  | * | 12/2000 | Nam ............................. 438/163 |
| 7,354,798 | B2 |   | 4/2008  | Pogge et al. |
| 7,456,094 | B2 | * | 11/2008 | Ma et al. ....................... 438/629 |
| 7,906,363 | B2 | * | 3/2011  | Koyanagi ......................... 438/66 |
| 7,930,664 | B2 | * | 4/2011  | Feng et al. ..................... 716/110 |
| 7,969,009 | B2 | * | 6/2011  | Chandrasekaran ........... 257/758 |
| 2005/0167782 | A1 | * | 8/2005 | Sanchez et al. ............... 257/532 |
| 2007/0216041 | A1 |   | 9/2007 | Patti et al. |
| 2008/0179688 | A1 | * | 7/2008 | Thei et al. ..................... 257/369 |
| 2009/0057890 | A1 |   | 3/2009 | Maebashi et al. |
| 2009/0061659 | A1 |   | 3/2009 | Maebashi |

(Continued)

FOREIGN PATENT DOCUMENTS

WO WO2007024022 A1 3/2007

OTHER PUBLICATIONS

C. Keast et al., "Three-Dimensional Integration Technology for Advanced Focal Planes", Lincoln Laboratory, Massachusetts Institute of Technology, Lexington, pp. 204-206.

(Continued)

*Primary Examiner* — A O Williams
(74) *Attorney, Agent, or Firm* — Michelle Gallardo (57) ABSTRACT

A stacked integrated circuit (IC) may be manufactured with a second tier wafer bonded to a double-sided first tier wafer. The double-sided first tier wafer includes back-end-of-line (BEOL) layers on a front and a back side of the wafer. Extended contacts within the first tier wafer connect the front side and the back side BEOL layers. The extended contact extends through a junction of the first tier wafer. The second tier wafer couples to the front side of the first tier wafer through the extended contacts. Additional contacts couple devices within the first tier wafer to the front side BEOL layers. When double-sided wafers are used in stacked ICs, the height of the stacked ICs may be reduced. The stacked ICs may include wafers of identical functions or wafers of different functions.

15 Claims, 11 Drawing Sheets

(56) References Cited

U.S. PATENT DOCUMENTS

| | | | |
|---|---|---|---|
| 2009/0325350 A1* | 12/2009 | Radosavljevic et al. | 438/163 |
| 2010/0019390 A1* | 1/2010 | Jung | 257/774 |
| 2010/0081232 A1* | 4/2010 | Furman et al. | 438/107 |
| 2010/0314737 A1* | 12/2010 | Henderson et al. | 257/686 |
| 2011/0012239 A1* | 1/2011 | Gu et al. | 257/637 |
| 2011/0068433 A1* | 3/2011 | Kim et al. | 257/531 |
| 2011/0075393 A1* | 3/2011 | Chandrasekaran et al. | 361/807 |
| 2011/0193197 A1* | 8/2011 | Farooq et al. | 257/618 |
| 2011/0193211 A1* | 8/2011 | Chandrasekaran et al. | 257/686 |

OTHER PUBLICATIONS

V. F. Pavlidis, et al., "Interconnect-based design methodologies for three-dimensional integrated circuits," Proc. of the IEEE, 366 pages, 2008.

International Search Report and Written Opinion—PCT/US2011/031386—ISA/EPO—Aug. 19, 2011.

* cited by examiner

DUAL-SIDE INTERCONNECTED CMOS FOR STACKED INTEGRATED CIRCUITS

TECHNICAL FIELD

The present disclosure generally relates to integrated circuits. More specifically, the present disclosure relates to packaging integrated circuits.

BACKGROUND

Stacked ICs increase device functionality and decrease occupied area by stacking dies vertically. In stacked ICs, a second die is stacked on a first die allowing construction to expand into three dimensions (3D). Stacked ICs allow products with a greater number of components to fit in small form factors. Component density of a semiconductor die is the number of components in the die divided by the die area. For example, stacking a die on an identical die results in approximately double the number of components in the same area to double component density. When a second die is stacked on a first die, the two dies share the same packaging and communicate to external devices through the packaging.

Dies may be stacked using several methods, including Package-on-Package (PoP) processes and through-silicon-stacking (TSS) processes. However, in some applications the height of the stacked IC is restricted. For example, ultra-thin cellular phones may not support stacked ICs having multiple dies. Thus, there is a need to reduce the thickness of stacked ICs.

BRIEF SUMMARY

According to one aspect of the disclosure, a stacked integrated circuit a first tier wafer. The stacked integrated circuit also includes a first extended contact extending through a junction in the first tier wafer for providing electrical connectivity through the first tier wafer. The stacked integrated circuit further includes a second tier wafer attached to the first tier wafer. The second tier wafer includes an electrical component electrically coupled to the first extended contact.

According to another aspect of the disclosure, a method of manufacturing a stacked integrated circuit includes thinning a first tier wafer to expose an extended contact extending through a junction of the first tier wafer. The extended contact being coupled to front side back-end-of-line layers. The method also includes depositing a dielectric on the first tier wafer after thinning the first tier wafer. The method further includes depositing back side back-end-of-line layers on the dielectric, the back side back-end-of line layers coupling to the extended contact. The method also includes bonding a second tier wafer to the first tier wafer after depositing the back side back-end-of-line layers so that circuitry on the second tier wafer is coupled to the front side back-end-of-line layers through the extended contact.

According to a further aspect of the disclosure, a method of manufacturing a stacked integrated circuit includes the steps of thinning a first tier wafer to expose a extended contact extending through at least one of a source region and a drain region of the first tier wafer. The extended contact being coupled to front side back-end-of-line layers. The method also includes the step of depositing a dielectric on the first tier wafer after thinning the first tier wafer. The method further includes the step of depositing back side back-end-of-line layers on the dielectric, the back side back-end-of line layers coupling to the extended contact. The method also includes the step of bonding a second tier wafer to the first tier wafer after depositing the back side back-end-of-line layers so that circuitry on the second tier wafer is coupled to the front side back-end-of-line layers through the extended contact.

According to another aspect of the disclosure, a sacked integrated circuit includes a first tier wafer having a first back-end-of-line layer on a front side and having a second back-end-of-line layer on a back side. The stacked integrated circuit also includes means for coupling the first back-end-of-line layer to the second back-end-of-line layer through a junction of the first tier wafer. The stacked integrated circuit further includes a first contact pad on the back side of the first tier wafer coupled to the second back-end-of-line layer. The stacked integrated circuit also includes a second tier wafer having a third a back-end-of-line layer on a front side. The stacked integrated circuit further includes a second contact pad on the front side of the second tier wafer coupled to the third back-end-of-line layer and coupled to the first contact pad. The coupling means couples the third back-end-of-line layer to the first back-end-of-line layer.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Reducing the height of stacked integrated circuits (ICs) may be accomplished with dual-side interconnected integrated circuits. According to one embodiment, a combination of regular contacts and extended contacts are etched in an integrated circuit. The regular contacts allow coupling to the front side of the integrated circuit, and the extended contacts allow coupling to the front side and back side of the integrated circuit. Dual-side integrated circuits allow construction of ultra-thin stacked integrated circuits. Additionally, very high density tier-to-tier connections in the stacked IC are made possible.

Figure 1:
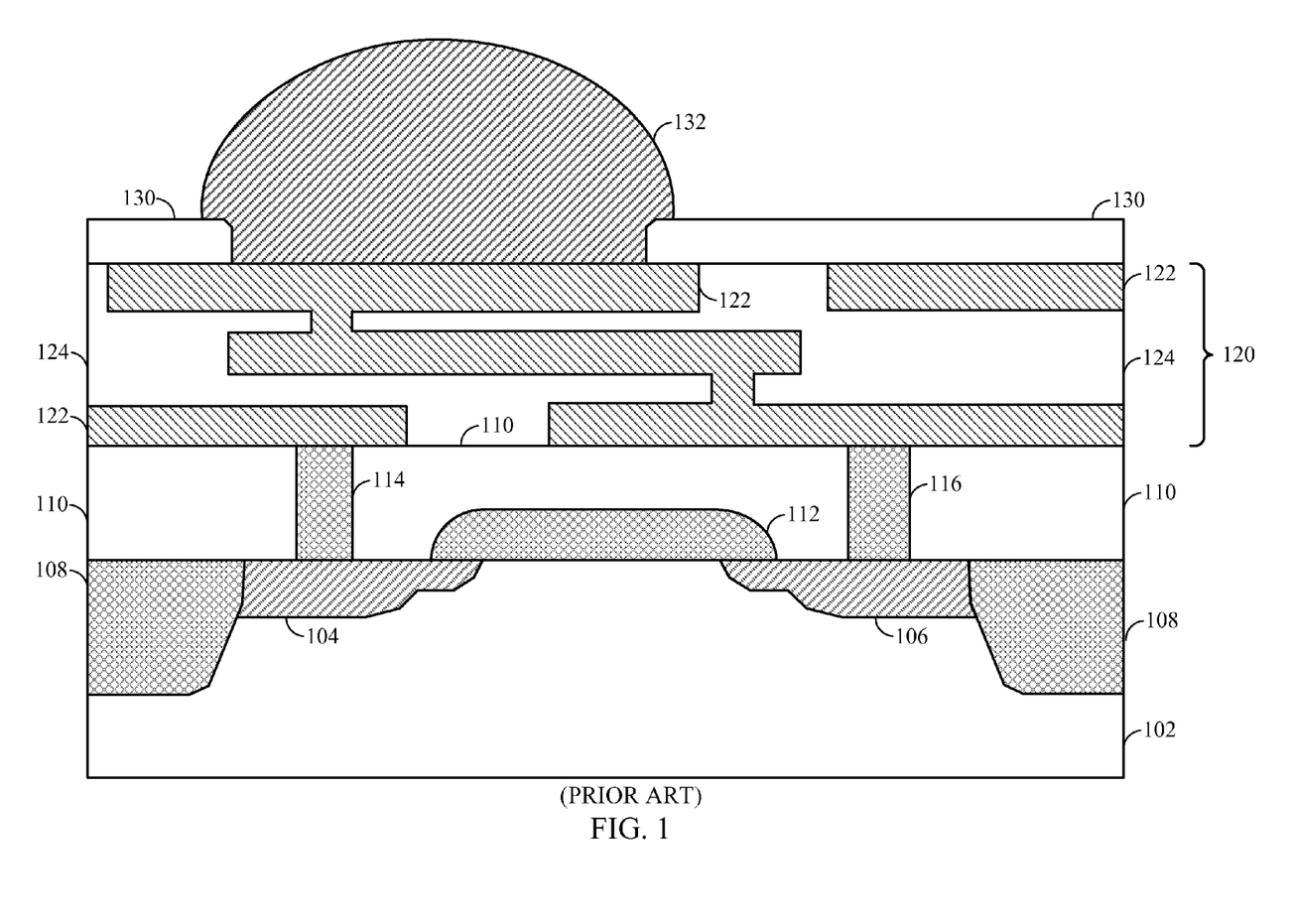
FIG. 1 is a cross-sectional view illustrating a conventional semiconductor die.

FIG. 1 is a cross-sectional view illustrating a conventional semiconductor die. A bulk semiconductor layer 102 such as silicon includes a source region 104 and a drain region 106. Trench isolation regions 108 isolate the regions 104, 106 from other regions in the bulk semiconductor layer 102. A gate structure 112 is formed between the regions 104, 106 and on the bulk semiconductor layer 102. A dielectric layer 110 is deposited on the bulk semiconductor layer 102 and the gate structure 112. Contacts 114, 116 extend through the dielectric layer 110 to the regions 104, 106, respectively. The contacts 114, 116 also couple to metal layers 122 in back-end-of-line (BEOL) layers 120. The BEOL layers 120 may also include a dielectric layer 124. A dielectric layer 130 is deposited on the BEOL layers 120 and a packaging structure 132 such as, for example, a flip-chip bump, couples to the metal layers 122.

Figure 2:
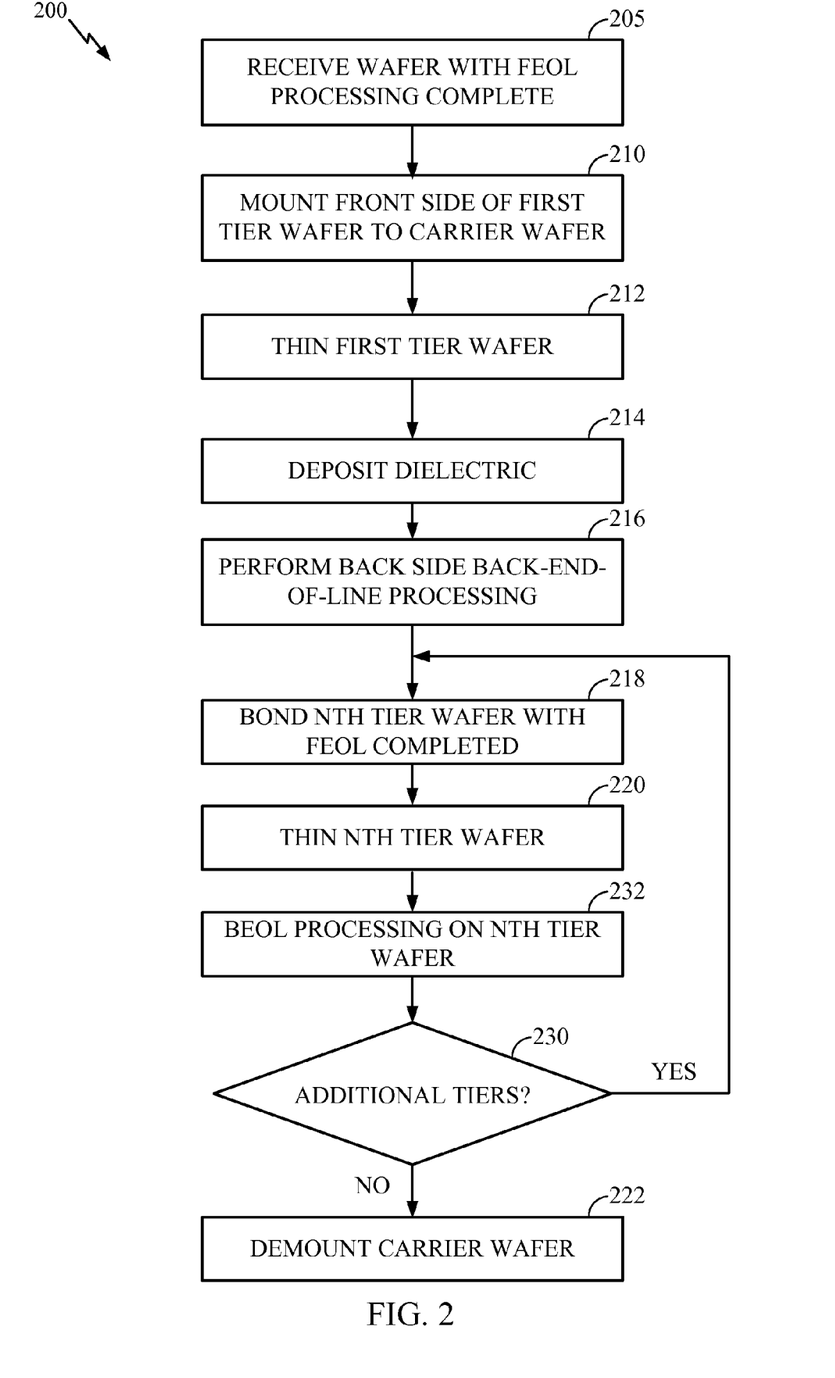
FIG. 2 is a flow chart illustrating an exemplary process for manufacturing dual-sided interconnected integrated circuits according to one embodiment.

FIG. 2 is a flow chart illustrating an exemplary process for manufacturing dual-sided interconnected integrated circuits according to one embodiment. An exemplary process 200 is illustrated with cross-sectional views of FIGS. 3A-G according to one embodiment.

Figure 3A:
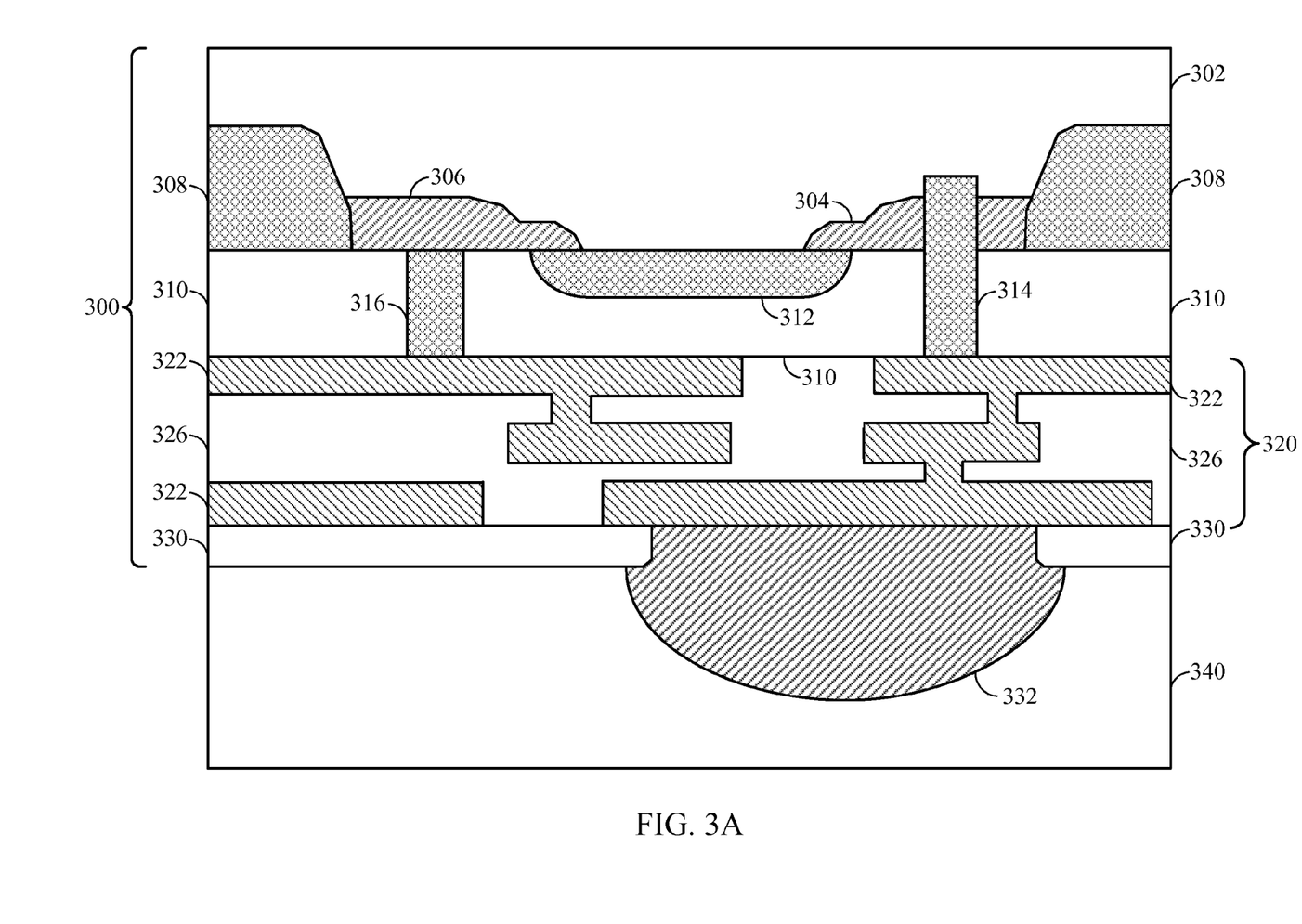
FIG. 3A-G are cross-sectional views illustrating an exemplary process for manufacturing dual-sided interconnected integrated circuits according to one embodiment.

The exemplary process 200 begins at block 205 with receiving a first tier wafer 300. The first tier wafer 300 may have front-end-of-line (FEOL) processing completed. The exemplary process 200 continues to block 210 with mounting a front side of the first tier wafer 300 to a carrier wafer 340. FIG. 3A is a cross-sectional view illustrating a first tier wafer mounted to the carrier wafer 340 according to one embodiment. The first tier wafer 300 includes a bulk semiconductor layer 302 having a source region 304 and a drain region 306. Trench isolation regions 308 isolate the regions 304, 306 from other regions in the bulk semiconductor layer 302. A gate structure 312 is formed between the regions 304, 306 and on the bulk semiconductor layer 302. A dielectric layer 310 is deposited on the bulk semiconductor layer 302 and the gate structure 312. A extended contact 314 and a contact 316 extend through the dielectric layer 310 to the regions 304, 306, respectively, forming junctions. According to one embodiment, the contacts 314, 316 are tungsten plugs. The contacts 314, 316 also couple to metal layers 322 in BEOL layers 320. In some embodiments, the extended contact 314 is formed after formation of the regions 304, 306, and the gate structure 312. According to one embodiment, the extended contact 314 extends through at least one of the regions 304, 306. Although not shown in FIG. 3A, the junction may be in a diode.

Additionally, a barrier layer (not shown) may be present between the extended contact 314 and the regions 304, 306. The barrier layer reduces metal contamination between the extended contact 314 and the regions 304, 306. The BEOL layers 320 may also include a dielectric layer 326. A dielectric layer 330 is deposited on the BEOL layers 320 and a packaging structure 332 such as, for example, a flip-chip bump, couples to the metal layers 322. The carrier wafer 340 is mounted to the first tier wafer 300. The carrier wafer 340 provides support for the first tier wafer 300 during later processing.

Figure 3B:
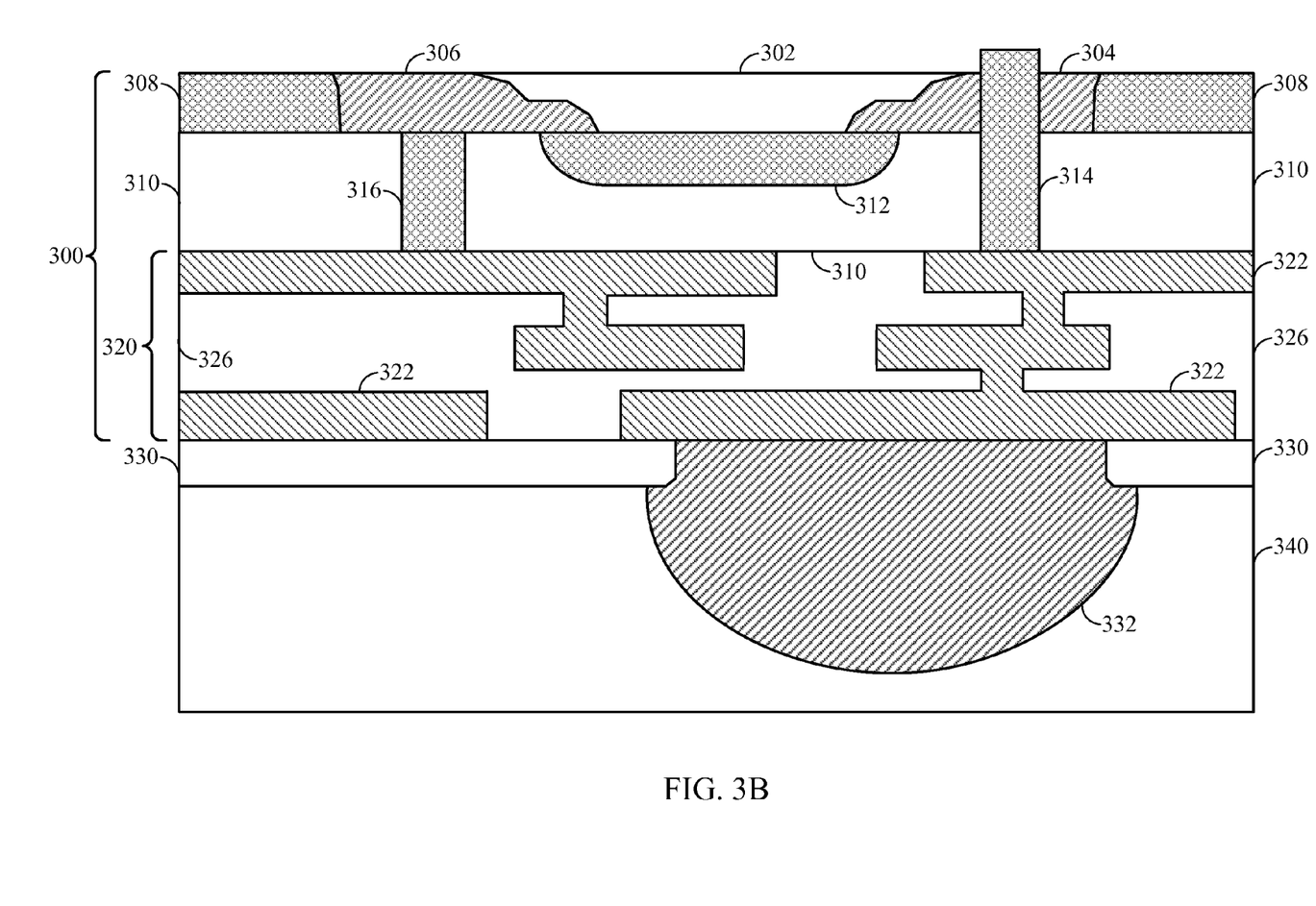

The exemplary process 200 continues to block 212 with thinning the first tier wafer 300. FIG. 3B is a cross-sectional view illustrating a first tier wafer after thinning according to one embodiment. The bulk semiconductor layer 302 of the first tier wafer 300 is thinned to expose region 304, region 306 and the extended contact 314. According to one embodiment, the thinning includes a recess etch.

Figure 3C:
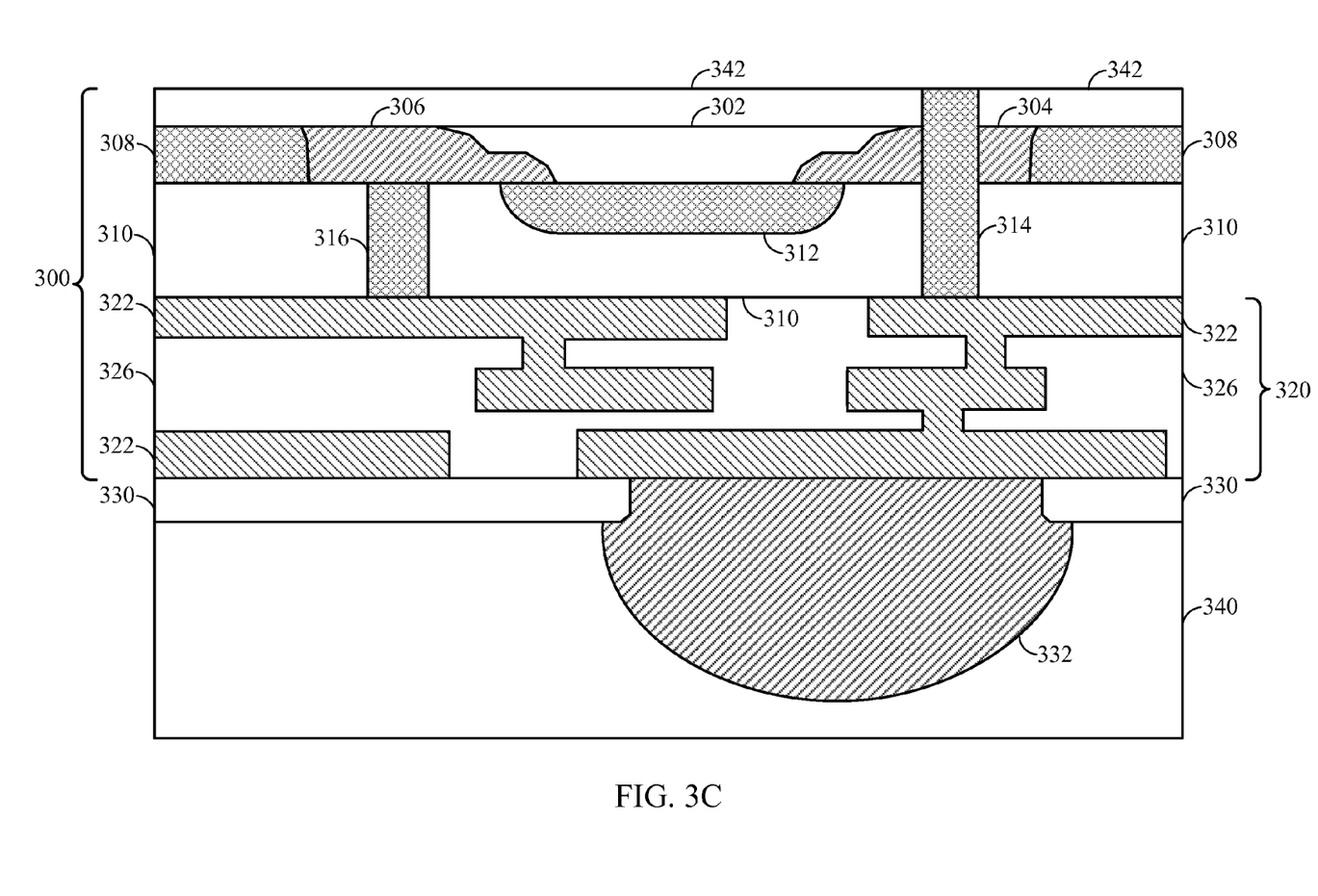

The exemplary process 200 continues to block 214 with depositing a dielectric layer 342 on the first tier wafer 300. FIG. 3C is a cross-sectional view illustrating a first tier wafer after dielectric deposition according to one embodiment. The dielectric layer 342 is deposited on the first tier wafer 300. The dielectric layer 342 may be, for example, silicon dioxide. According to one embodiment, a conformal dielectric layer 342 is deposited to cover the extended contact 314. In this embodiment, chemical mechanical polishing (CMP) etches the dielectric layer 342 to expose the extended contact 314 and to leave the dielectric layer 342 at a substantially similar level as the extended contact 314.

Figure 3D:
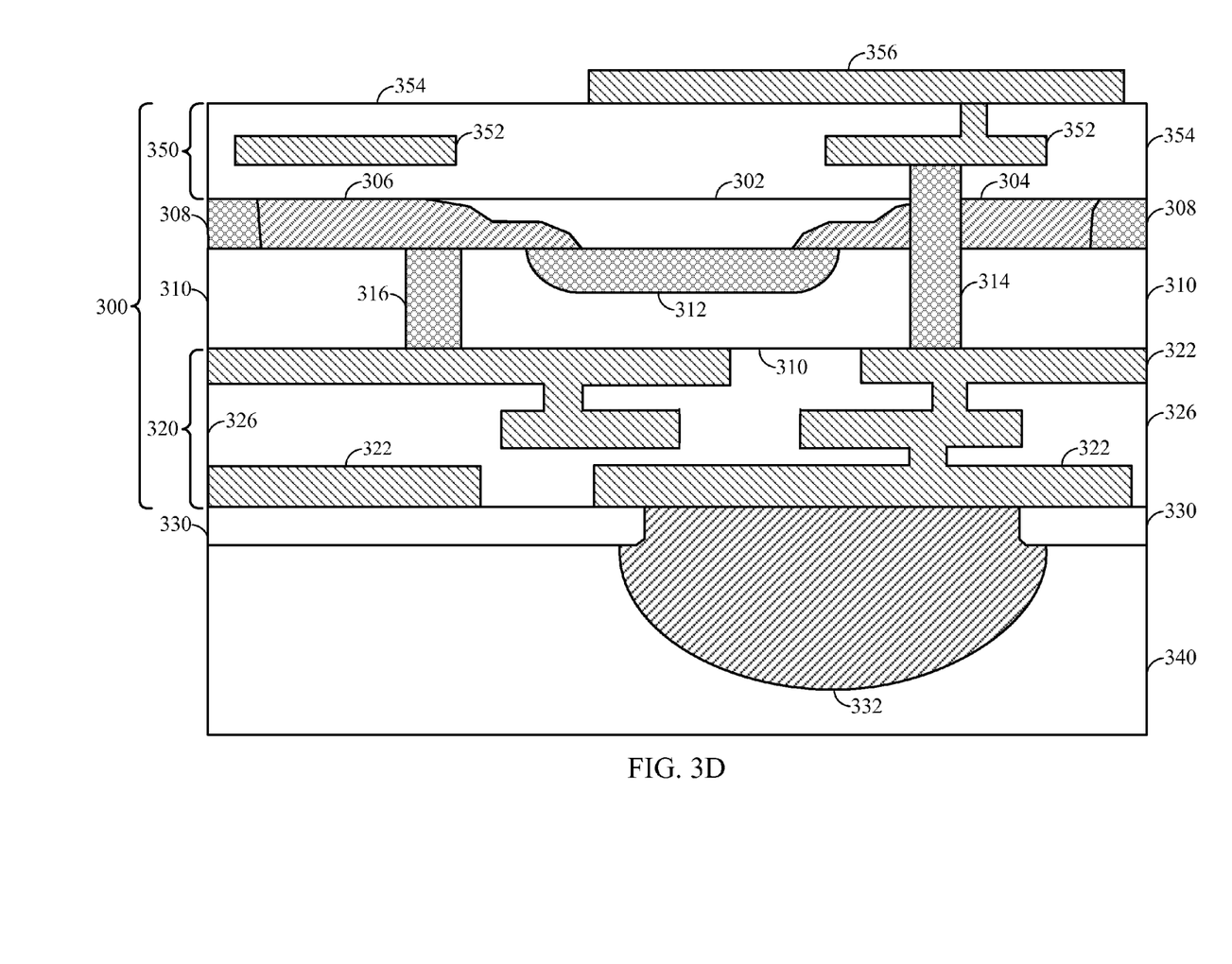

The exemplary process 200 continues to block 216 with back side BEOL processing. FIG. 3D is a cross-sectional view illustrating a first tier wafer after BEOL processing according to one embodiment. During BEOL processing BEOL layers 350, including a dielectric layer 354, metal layers 352, and contact pad 356, are deposited on the first tier wafer 300. According to one embodiment, microbumping is also performed on the first tier wafer 300 as part of the BEOL processing. The first tier wafer 300 is two-sided because BEOL layers 320, 350 are located on the front and back side of the first tier wafer 300, respectively.

Figure 3E:
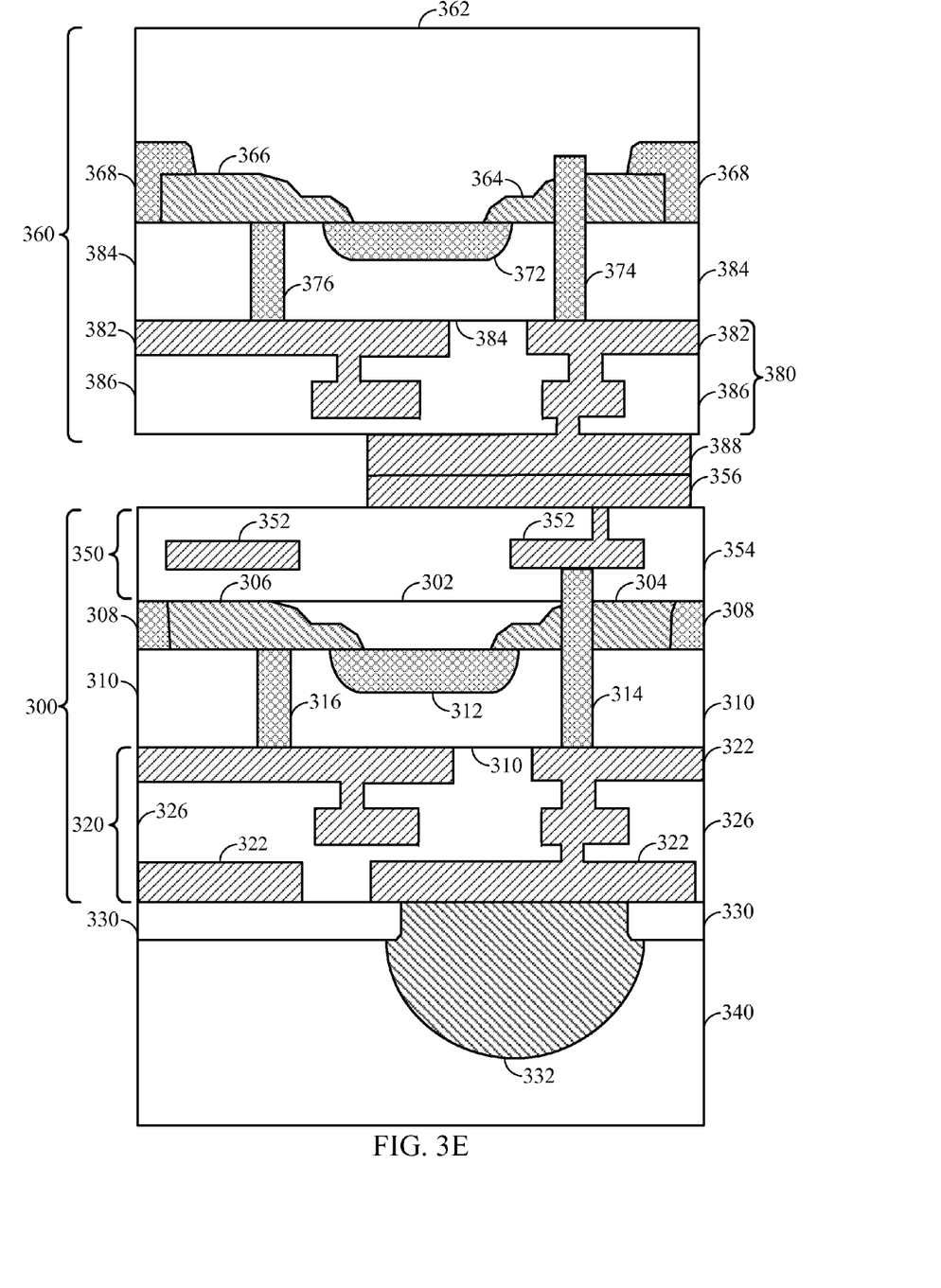

The exemplary process 200 continues to block 218 with bonding a second tier wafer 360 to the first tier wafer 300. FIG. 3E is a cross-sectional view illustrating a first tier wafer bonded to a second tier wafer according to one embodiment. The second tier wafer 360 includes a bulk semiconductor layer 362 having a source region 364 and a drain region 366. A gate structure 372 is located on the bulk semiconductor layer 362 between the regions 364, 366. Trench isolation regions 368 separate the regions 364, 366 from other source and drain regions (not shown) in the bulk semiconductor layer 362. A dielectric layer 384 is deposited on the bulk semiconductor layer 362 and the gate structure 372. A extended contact 374 and a regular contact 376 extend through the dielectric layer 384 to the regions 364, 366, respectively. BEOL layers 380 include metal layers 382 and a dielectric layer 386. Additionally, a contact pad 388 couples to the metal layers 382.

The second tier wafer 360 couples to the first tier wafer 300 through the contact pad 388 of the second tier wafer 360 and the contact pad 356 of the first tier wafer 300. According to one embodiment, the first tier wafer 300 is coupled to the second tier wafer 360 through copper-copper bonding.

Figure 3F:
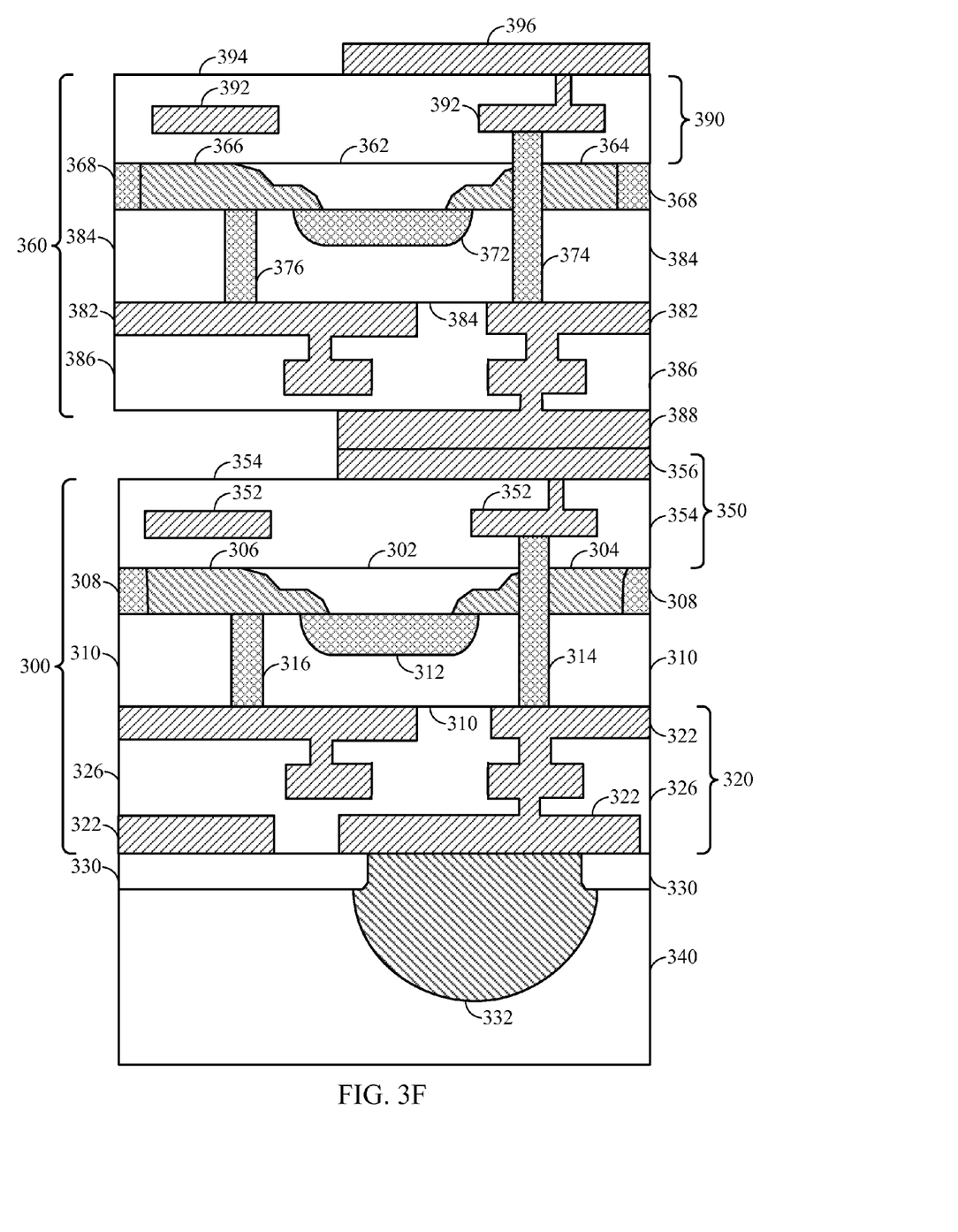

The exemplary process 200 continues to block 220 with thinning the second tier wafer 360. FIG. 3F is a cross-sectional view illustrating a stacked integrated circuit after thinning of the second tier wafer according to one embodiment. The bulk semiconductor layer 362 of the second tier wafer 360 is thinned to expose the extended contact 374.

After thinning the second tier wafer 360 at block 220, the exemplary process continues to block 232 to perform BEOL processing on the second tier wafer 360. Referring again to FIG. 3F, BEOL layers 390 are deposited on the second tier wafer 360 including a dielectric layer 394 and metal layers 392, and a contact pad 396 is coupled to the metal layers 392. According to one embodiment, the BEOL layers 390 and the contact pad 396 are not deposited on the second tier wafer 360 if no additional tiers will be stacked on the second tier wafer 360.

The exemplary process 200 continues to decision block 230 to determine if additional tiers are to be stacked in the stacked IC. If additional tiers exist, the exemplary process 200 continues to block 218 for an nth tier (e.g., third tier). If no additional tiers exist, the exemplary process 200 continues to block 222.

Figure 3G:
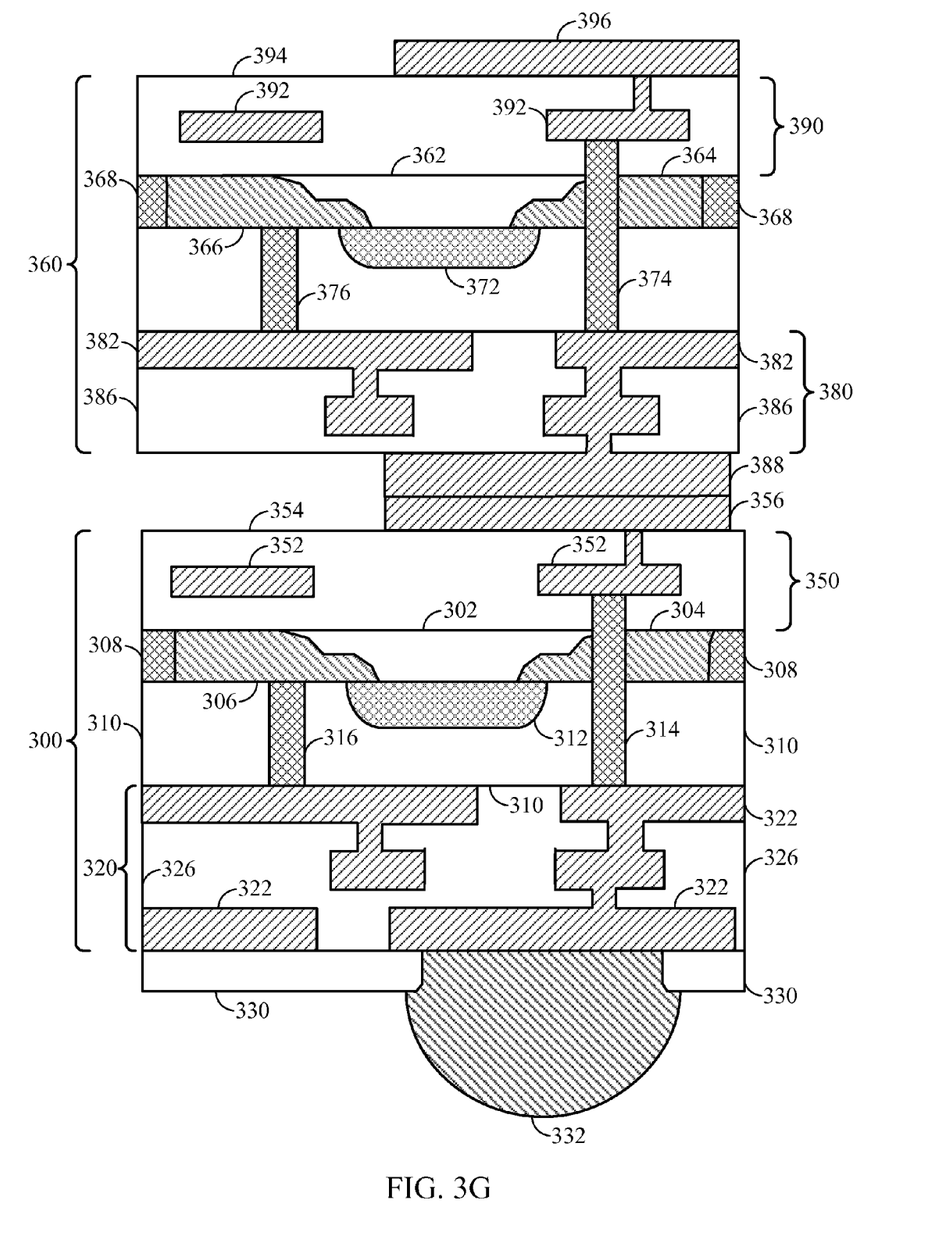

At block 222 of the exemplary process 200 the first tier wafer 300 is demounted from the carrier wafer 340. FIG. 3G is a cross-sectional view illustrating a stacked integrated circuit after demounting of the carrier wafer according to one embodiment. After demounting, the packaging structure 332 is exposed for further processing.

Although the exemplary process 200 is illustrated with wafers, the exemplary process 200 may also be performed when stacking dies. For example, after a first tier wafer is bonded to a carrier wafer, the second, third, or nth tier may be a wafer or a die.

The exemplary process for stacking integrated circuits described above includes dual-sided interconnects to reduce the height of the stacked IC. The process may be applied to stacked ICs having identical wafers or heterogeneous wafers with different functions. For example, a stacked IC manufactured using the exemplary process may include an application-specific integrated circuit (ASIC) in the first tier wafer and memory in the second tier wafer. Formation of extended contacts in the wafers costs less than through silicon vias (TSV), and the extended contacts may be manufactured at sub-micron sizes reducing parasitic capacitance of the contact. For example, the extended contacts may be 50-100 nanometers in diameter at 45-65 nanometer process nodes.

Another advantage of the dual-sided integrated circuits is the placement of BEOL layers on the front and back side of the wafer. Two sets of BEOL layers allows improved wiring efficiency in comparison to a single set of BEOL layers. Additionally, high density tier-to-tier connections are possible at a transistor level or macro level and may include power and ground connections. For example, tier-to-tier connections of $10^4$-$10^5$ connections/square millimeter are possible.

Figure 4:
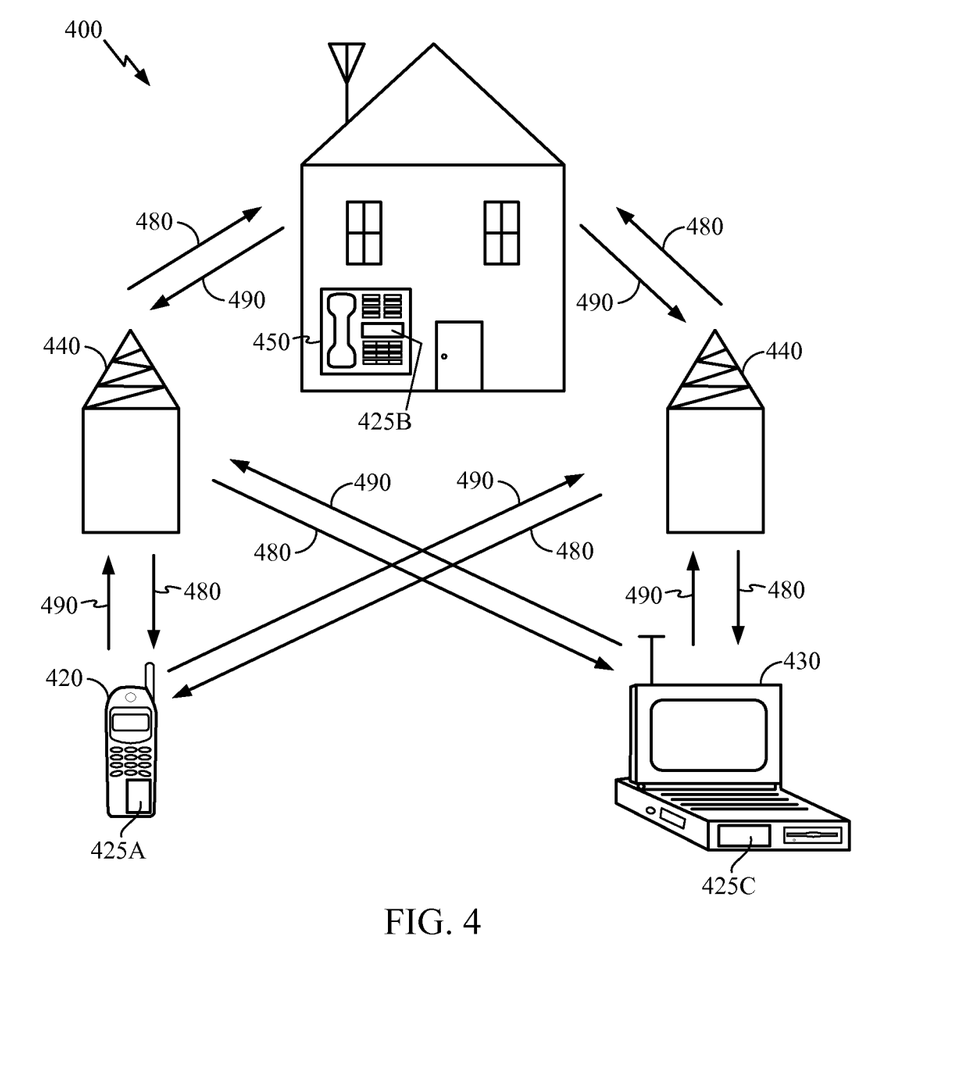
FIG. 4 is a block diagram showing an exemplary wireless communication system in which an embodiment may be advantageously employed.

FIG. 4 shows an exemplary wireless communication system 400 in which an embodiment of the disclosure may be advantageously employed. For purposes of illustration, FIG. 4 shows three remote units 420, 430, and 450 and two base stations 440. It will be recognized that wireless communication systems may have many more remote units and base stations. Remote units 420, 430, and 450 include stacked ICs 425A, 425C, and 425B, respectively, which are embodiments as discussed above. FIG. 4 shows forward link signals 480 from the base stations 440 and the remote units 420, 430, and 450 and reverse link signals 490 from the remote units 420, 430, and 450 to base stations 440.

In FIG. 4, remote unit 420 is shown as a mobile telephone, remote unit 430 is shown as a portable computer, and remote unit 450 is shown as a computer in a wireless local loop system. For example, the remote units may be cell phones, mobile phones, computers, set top boxes, music players, video players, entertainment units, hand-held personal communication systems (PCS) units, portable data units such as personal data assistants, or fixed location data units such as meter reading equipment. Although FIG. 4 illustrates remote units according to the teachings of the disclosure, the disclosure is not limited to these exemplary illustrated units. The disclosure may be suitably employed in any device which includes stacked ICs.

Figure 5:
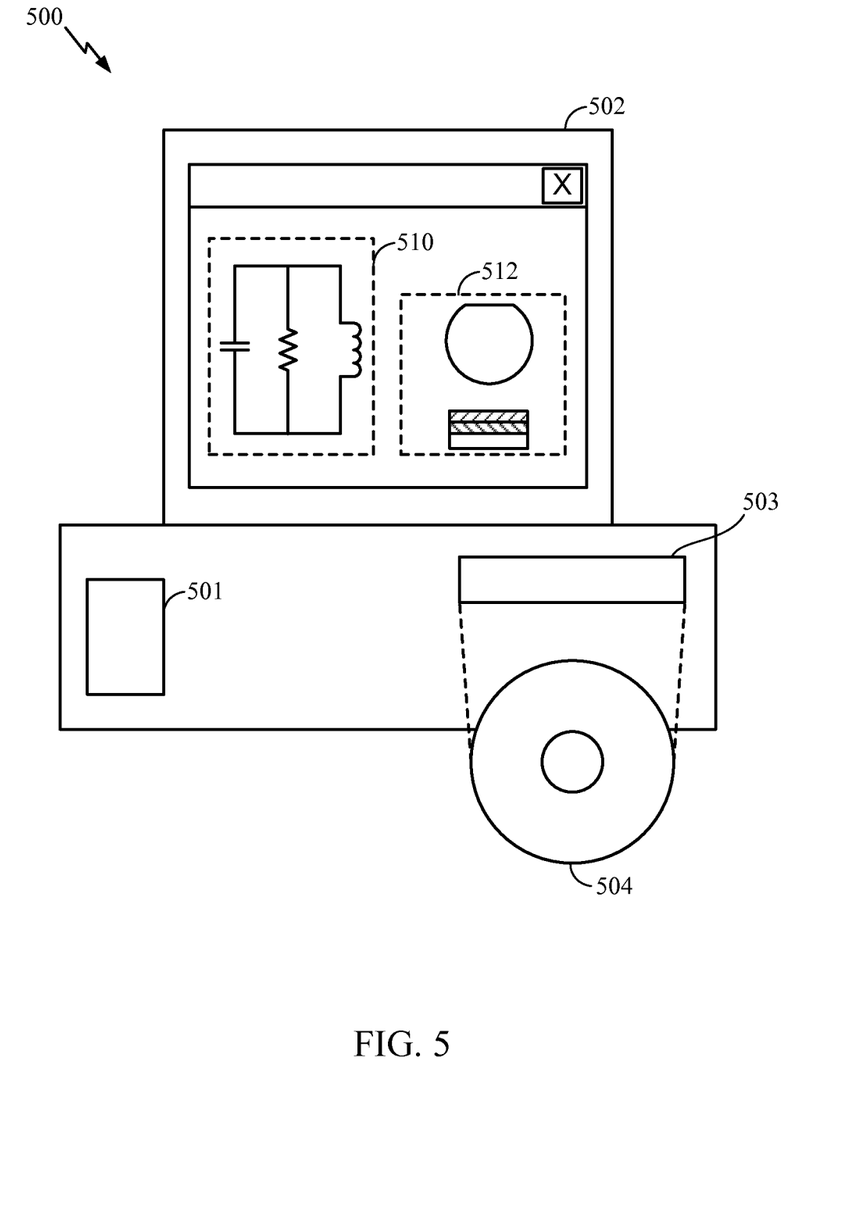
FIG. 5 is a block diagram illustrating a design workstation used for circuit, layout, and logic design of a semiconductor component according to one embodiment.

FIG. 5 is a block diagram illustrating a design workstation used for circuit, layout, and logic design of a semiconductor component as disclosed below. A design workstation 500 includes a hard disk 501 containing operating system software, support files, and design software such as Cadence or OrCAD. The design workstation 500 also includes a display to facilitate design of a circuit 510 or a semiconductor component 512 such as a wafer or die. A storage medium 504 is provided for tangibly storing the circuit design 510 or the semiconductor component 512. The circuit design 510 or the semiconductor component 512 may be stored on the storage medium 504 in a file format such as GDSII or GERBER. The storage medium 504 may be a CD-ROM, DVD, hard disk, flash memory, or other appropriate device. Furthermore, the design workstation 500 includes a drive apparatus 503 for accepting input from or writing output to the storage medium 504.

Data recorded on the storage medium 504 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 504 facilitates the design of the circuit design 510 or the semiconductor component 512 by decreasing the number of processes for designing semiconductor wafers.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the terminology "through silicon via" includes the word silicon, it is noted that through silicon vias are not necessarily constructed in silicon. Rather, the material can be any device substrate material.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit, comprising:
   a first tier;
   a first back-end-of-line layer on a first side of the first tier, the first back-end-of-line layer comprising a conductive layer coupled to a contact point on a surface of the first tier by a via; and
   a first contact extending through opposing surfaces of a source region or a drain region in the first tier, the first contact coupled to the conductive layer opposite the via and configured to provide an electrical path through the first tier.

2. The integrated circuit of claim 1, further comprising:
   a second back-end-of-line layer on a second side of the first tier, in which the first contact couples the first back-end-of-line layer to the second back-end-of-line layer;
   a first contact pad on the second side of the first tier coupled to the second back-end-of-line layer;
   a third back-end-of-line layer coupled to an electrical component on a first side of the second tier; and
   a second contact pad on the first side of the second tier coupled between the third back-end-of-line layer and the first contact pad, the first contact coupling the third back-end-of-line layer to the first back-end-of-line layer.

3. The integrated circuit of claim 2, further comprising:
   a fourth back-end-of-line layer on a second side of the second tier;
   a third contact pad on the second side of the second tier coupled to the fourth back-end-of-line layer;
   a second contact in the second tier that couples the third back-end-of-line layer to the fourth back-end-of-line layer;
   a third tier having a fifth back-end-of-line layer on a first side of the third tier; and
   a fourth contact pad coupled to the fifth back-end-of-line layer and coupled to the third contact pad, the first contact and the second contact coupling the fifth back-end-of-line layer to the first back-end-of-line layer.

4. The integrated circuit of claim 2, further comprising a packaging structure on the first side of the first tier coupled to the third back-end-of-line layer through the first contact.

5. The integrated circuit of claim 1, in which the first contact comprises a tungsten plug.

6. The integrated circuit of claim 1, integrated into a mobile phone, a set top box, a music player, a video player, an entertainment unit, a navigation device, a computer, a hand-held personal communication systems (PCS) unit, a portable data unit, and/or a fixed location data unit.

7. A stacked integrated circuit, comprising:
   a first tier having a first back-end-of-line layer on a first side and having a second back-end-of-line layer on a second side;
   means for coupling the first back-end-of-line layer to the second back-end-of-line layer through a junction of the first tier;
   a first contact pad on the second side of the first tier coupled to the second back-end-of-line layer;
   a second tier having a third back-end-of-line layer on a first side; and
   a second contact pad on the first side of the second tier coupled to the third back-end-of-line layer and coupled to the first contact pad, the coupling means coupling the third back-end-of-line layer to the first back-end-of-line layer.

8. The stacked integrated circuit of claim 7, integrated into a mobile phone, a set top box, a music player, a video player, an entertainment unit, a navigation device, a computer, a hand-held personal communication systems (PCS) unit, a portable data unit, and/or a fixed location data unit.

9. The integrated circuit of claim 1, further comprising:
   a second tier attached to the first tier, the second tier including an electrical component electrically coupled to the first contact.

10. The integrated circuit of claim 1, further comprising:
    a second back-end-of-line layer on a second side of the first tier, in which the first contact couples the first back-end-of-line layer to the second back-end-of-line layer.

11. The integrated circuit of claim 10, further comprising a contact pad coupled to the first contact, the contact pad configured to electrically couple the first tier to a second tier.

12. An integrated circuit, comprising:
    a first tier;
    a first back-end-of-line layer on a first side of the first tier, the first back-end-of-line layer comprising means for conducting electricity coupled to a contact point on a surface of the first tier by means for coupling to the contact point; and
    first means for providing an electrical path through the first tier, the first electrical path means extending through opposing surfaces of a source region or a drain region in the first tier, the first electrical path means coupled to the conducting means opposite the coupling means.

13. The integrated circuit of claim 12, further comprising:
    a second tier attached to the first tier, the second tier including an electrical component electrically coupled to the first electrical path means.

14. The integrated circuit of claim 12, further comprising:
    a second back-end-of-line layer on a second side of the first tier, in which the first electrical path means couples the first back-end-of-line layer to the second back-end-of-line layer.

15. The integrated circuit of claim 12, integrated into a mobile phone, a set top box, a music player, a video player, an entertainment unit, a navigation device, a computer, a hand-held personal communication systems (PCS) unit, a portable data unit, and/or a fixed location data unit.

* * * * *